United States Patent
Su et al.

(10) Patent No.: US 10,734,950 B2
(45) Date of Patent: Aug. 4, 2020

(54) PHASE NOISE COMPENSATION APPARATUS AND METHOD AND RECEIVER

(71) Applicant: FUJITSU LIMITED, Kawasaki-shi, Kanagawa (JP)

(72) Inventors: Xiaofei Su, Beijing (CN); Zhenning Tao, Beijing (CN)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/288,653

(22) Filed: Feb. 28, 2019

(65) Prior Publication Data

US 2019/0348950 A1 Nov. 14, 2019

(30) Foreign Application Priority Data

May 8, 2018 (CN) .......................... 2018 1 0430182

(51) Int. Cl.
| | |
|---|---|
| *H03D 3/24* | (2006.01) |
| *H04L 27/227* | (2006.01) |
| *H04L 27/38* | (2006.01) |
| *H04L 27/00* | (2006.01) |

(52) U.S. Cl.
CPC ......... *H03D 3/242* (2013.01); *H04L 27/2275* (2013.01); *H04L 27/3809* (2013.01); *H04L 2027/0038* (2013.01)

(58) Field of Classification Search
CPC . H03D 3/242; H04L 27/2275; H04L 27/3809; H04L 2027/0038
See application file for complete search history.

(56) References Cited

U.S. PATENT DOCUMENTS

| | | | |
|---|---|---|---|
| 5,109,532 A | 4/1992 | Petrovic et al. | |
| 7,058,002 B1 * | 6/2006 | Kumagai | H04L 27/2662 370/203 |
| 2004/0219884 A1 * | 11/2004 | Mo | H03D 3/009 455/67.11 |
| 2013/0259106 A1 * | 10/2013 | Tarighat Mehrabani | H04B 17/11 375/226 |
| 2017/0155448 A1 * | 6/2017 | Krishnan | H04B 10/6161 |

FOREIGN PATENT DOCUMENTS

| | | |
|---|---|---|
| CN | 1677876 | 10/2005 |
| CN | 102137412 | 7/2011 |
| CN | 107171735 | 9/2017 |

OTHER PUBLICATIONS

Chen, Z., et al., "Effects of LO Phase and Amplitude Imbalances and Phase Noise on M-QAM Transceiver Performance", in IEEE Transactions on Industrial Electronics, vol. 57, No. 5, May 2010, pp. 1505-1517.

* cited by examiner

*Primary Examiner* — David B Lugo
(74) *Attorney, Agent, or Firm* — Staas & Halsey LLP

(57) ABSTRACT

Embodiments of this disclosure provide a phase noise compensation apparatus and method and a receiver, in which modified signals are determined according to estimated values of an imperfection parameter of a transmitter and training sequence signals in transmission signals, and phase noises of the received signals are determined according to the modified signals, hence, an effect of the imperfection parameter of the transmitter on the phase noise is taken into account, and the phase noise may be accurately estimated, thereby performing compensation on the phase noise, and ensuring a transmission efficiency and performance of the system.

8 Claims, 4 Drawing Sheets

PHASE NOISE COMPENSATION APPARATUS AND METHOD AND RECEIVER

CROSS-REFERENCE TO RELATED APPLICATIONS

This application claims the priority benefit of Chinese Patent Application No. 201810430182.4, filed May 8, 2018, in the State Intellectual Property Office of China, the disclosure of which is incorporated herein by reference.

TECHNICAL FIELD

This disclosure relates to the field of communication technologies, and in particular to a phase noise compensation apparatus and method and a receiver.

BACKGROUND

A coherent optical communication system occupies an important position in a communication transmission network for its huge transmission bandwidth, great potential for expansion, extremely low transmission loss and low cost. It is key to select an appropriate modulation format in building a coherent optical communication network of low cost, large capacity and high spectral efficiency. In recent years, flexible and variable modulation formats have become hot spots as the most effective way to increase transmission rates. High-order quadrature amplitude modulation (QAM) is becoming a mainstream solution for next-generation optical communication systems. And a complex QAM modulation format is particularly sensitive to phase noises.

Existing phase noise compensation methods are generally based on a blind phase search scheme or a carrier phase estimation scheme based on interleaving quadrature phase shift keying (QPSK) to compensate for phase noises caused by a laser.

It should be noted that the above description of the background is merely provided for clear and complete explanation of this disclosure and for easy understanding by those skilled in the art. And it should not be understood that the above technical solution is known to those skilled in the art as it is described in the background of this disclosure.

SUMMARY

It was found by inventors that a complex QAM modulation format is not only sensitive to phase noises of a laser, but also sensitive to phase noises due to imperfections of a device, and is prone to be affected by a direct current bias, amplitude imbalance and phase imbalance of an I path and a Q path of a transmitter, which may result in severe code errors, and greatly limit transmission efficiency of the system. The phase noises due to imperfections of the transmitter are not taken into account in the existing phase noise compensation methods, thereby affecting an effect of phase noise compensation, and limiting the transmission efficiency of the system.

Embodiments of this disclosure provide a phase noise compensation apparatus and method and a receiver, in which modified signals are determined according to estimated values of an imperfection parameter of a transmitter and training sequence signals in transmission signals, and phase noises of the received signals are determined according to the modified signals, hence, an effect of the imperfections of the transmitter on the phase noise is taken into account, and the phase noise may be accurately estimated, thereby performing compensation on the phase noise effectively, and ensuring a transmission efficiency and performance of the system.

According to an embodiment, a phase noise compensation apparatus may include a memory and a processor coupled to the memory.

According to an embodiment of this disclosure, there is provided a phase noise compensation apparatus, including a processor configured to determine estimated values of an imperfection parameter that affects performance of a transmitter according to received signals; determine modified signals according to the determined estimated values of the imperfection parameter of the transmitter and training sequence signals interpolated into transmission signals of the transmitter, determine phase noises of the received signals according to the modified signals; and perform phase noise compensation on the received signals according to the phase noises of the received signals.

According to an embodiment of this disclosure, there is provided a receiver, including the phase noise compensation apparatus as above described.

According to a third aspect of the embodiments of this disclosure, there is provided a phase noise compensation method, including: determining estimated values of an imperfection parameter that affects performance of a transmitter according to received signals, determining modified signals according to the determined estimated values of the imperfection parameter of the transmitter and training sequence signals interpolated into transmission signals of the transmitter, determining phase noises of the received signals according to the modified signals, and performing phase noise compensation on the received signals according to the phase noises of the received signals.

Advantages of the embodiments of this disclosure exists in that the modified signals are determined according to the estimated values of the imperfection parameter of the transmitter and the training sequence signals in the transmission signals, and the phase noises of the received signals are determined according to the modified signals, hence, the effect of the imperfection parameter of the transmitter on the phase noise is taken into account, and the phase noise may be accurately estimated, thereby performing compensation on the phase noise effectively, and ensuring the transmission efficiency and performance of the system.

With reference to the following description and drawings, the particular embodiments of this disclosure are disclosed in detail, and the principle of this disclosure and the manners of use are indicated. It should be understood that the scope of the embodiments of this disclosure is not limited thereto. The embodiments of this disclosure contain many alternations, modifications and equivalents within the scope of the terms of the appended claims.

Features that are described and/or illustrated with respect to one embodiment may be used in the same way or in a similar way in one or more other embodiments and/or in combination with or instead of the features of the other embodiments.

It should be emphasized that the term "comprises/comprising/includes/including" when used in this specification is taken to specify the presence of stated features, integers, steps or components but does not preclude the presence or addition of one or more other features, integers, steps, components or groups thereof.

BRIEF DESCRIPTION OF THE DRAWINGS

The drawings are included to provide further understanding of this disclosure, which constitute a part of the specification and illustrate the preferred embodiments of this disclosure, and are used for setting forth the principles of this disclosure together with the description. It is obvious that the accompanying drawings in the following description are some embodiments of this disclosure, and for those of ordinary skills in the art, other accompanying drawings may be obtained according to these accompanying drawings without making an inventive effort. In the drawings.

DETAILED DESCRIPTION

Reference will now be made in detail to embodiments, examples of which are illustrated in the accompanying drawings. In this regard, the embodiments may have different forms and should not be construed as being limited to the descriptions set forth herein. In order to further clearly describe features of the embodiments, descriptions of other features that are well known to one of ordinary skill in the art are omitted here.

In the embodiments of this disclosure, terms "first", and "second", etc., are used to differentiate different elements with respect to names, and do not indicate spatial arrangement or temporal orders of these elements, and these elements should not be limited by these terms. Terms "and/or" include any one and all combinations of one or more relevantly listed terms. Terms "contain", "include" and "have" refer to existence of stated features, elements, components, or assemblies, but do not exclude existence or addition of one or more other features, elements, components, or assemblies.

In the embodiments of this disclosure, single forms "a", and "the", etc., include plural forms, and should be understood as "a kind of" or "a type of" in a broad sense, but should not defined as a meaning of "one"; and the term "the" should be understood as including both a single form and a plural form, except specified otherwise. Furthermore, the term "according to" should be understood as "at least partially according to", the term "based on" should be understood as "at least partially based on", except specified otherwise.

A "unit" as used herein may denote a hardware apparatus, an electronic device, a computer hardware or respective components thereof such as a chipset, a circuit performing a particular function in an electronic device, and/or software executed by a computing hardware, to perform a function.

These and further aspects and features of the present disclosure will be apparent with reference to the following description and attached drawings. In the description and drawings, particular embodiments of the disclosure have been disclosed in detail as being indicative of some of the ways in which the principles of the disclosure may be employed, but it is understood that the disclosure is not limited correspondingly in scope. Rather, the disclosure includes all changes, modifications and equivalents coming within the terms of the appended claims.

Embodiment 1

Figure 1:
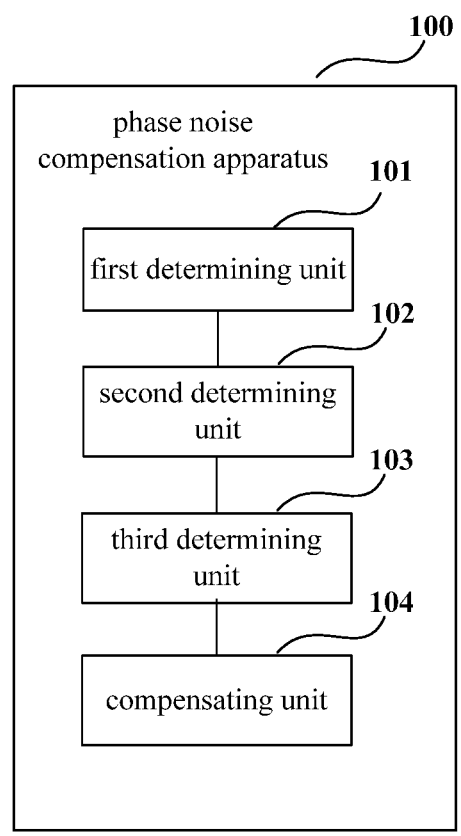
FIG. 1 is a schematic diagram of the phase noise compensation apparatus according to an embodiment of this disclosure.

The embodiment of this disclosure provides a phase noise compensation apparatus, which is provided at a receiver end of an optical communication system. FIG. 1 is a schematic diagram of the phase noise compensation apparatus of Embodiment 1 of this disclosure. As shown in FIG. 1, a phase noise compensation apparatus 100 includes:

a first determining unit 101 configured to determine estimated values of an imperfection parameter of a transmitter according to received signals;

a second determining unit 102 configured to determine modified signals according to the estimated values of the imperfection parameter of the transmitter and training sequence signals interpolated into transmission signals of the transmitter;

a third determining unit 103 configured to determine phase noises of the received signals according to the modified signals; and a compensating unit 104 configured to perform phase noise compensation on the received signals according to the phase noises of the received signals.

It can be seen from the above embodiment that the modified signals are determined according to the estimated values of the imperfection parameter of the transmitter and the training sequence signals in the transmission signals, and the phase noises of the received signals are determined according to the modified signals, hence, the effect of the imperfection parameter of the transmitter on the phase noise is taken into account, and the phase noise may be accurately estimated, thereby performing compensation on the phase noise effectively, and ensuring the transmission efficiency and performance of the system.

In this embodiment, for example, the imperfection parameter of the transmitter includes at least one of estimated values of amplitude imbalance of an I path and a Q path of the transmitter, phase imbalance of the I path and the Q path of the transmitter, and estimated values of a direct current bias of the transmitter. While some examples of an imperfection parameter are described herein as an example, the present invention is not limited thereto. As such, an imperfection parameter as referenced herein may include any parameter that affects performance and/or efficiency of transmission.

In this embodiment, reference may be made to related techniques for determining the estimated values of the imperfection parameter of the transmitter by the first determining unit 101. For example, for the received signals, signals after being performed carrier phase recovery are averaged to obtain the estimated values of the direct current bias; signals with the direct current bias being removed are inputted into a butterfly finite impulse response (FIR) filter, and filter tap coefficients are iterated according to a least-mean square (LMS) method; and finally, the estimated values of the amplitude imbalance and the phase imbalance may be obtained through calculation according to converged filter tap coefficients.

In this embodiment, as the imperfection parameter of the transmitter is kept relatively stable within a certain period of time, such as a few seconds, the estimated values of the imperfection parameter of the transmitter may be updated at a certain period.

In this embodiment, the second determining unit 102 determines the modified signals according to the estimated values of the imperfection parameter of the transmitter and the training sequence signals interpolated into the transmission signals of the transmitter.

For example, under an ideal condition, the transmission signals of the transmitter may be expressed as:

$$S(i)=I(i)+jQ(i) \quad (1);$$

where, S(i) denotes an i-th transmission signal, I(i) denotes an I path signal in the i-th transmission signal, and Q(i) denotes a Q path signal in the i-th transmission signal.

Due to imperfections of the transmitter, modulated transmission signals of the transmitter may be expressed as:

$$S_M(i)=ae^{j\theta_I}*I(i)+be^{j\theta_Q}*jQ(i)+I_0+jQ_0 \quad (2);$$

where, $S_M(i)$ denotes an i-th modulated transmission signal, a and b respectively denote amplitudes of the I path and the Q path, $\theta_I$ and $\theta_Q$ respectively denote phases of the I path and the Q path, and $I_0+jQ_0$ denotes the direct current bias of the transmitter.

At a receiver end, after being equalization and frequency offset compensation processed, the received signals still contains information on the phase noises and the imperfections of the transmitter, and before the phase noise compensation is performed, the received signals may be expressed as:

$$Y(i)=(ae^{j\theta_I}*I(i)+be^{j\theta_Q}*jQ(i)+I_0+jQ_0)*e^{j\varphi(i)} \quad (3);$$

where, Y(i) denotes an i-th received signal before the phase noise compensation is performed, a and b respectively denote amplitudes of the I path and the Q path, $\theta_I$ and $\theta_Q$ respectively denote phases of the I path and the Q path, $I_0+jQ_0$ denotes the direct current bias of the transmitter, and $\varphi(i)$ denotes a phase noise of the i-th received signal.

In this embodiment, the training sequence signals interpolated into the transmission signals of the transmitter may be signals of any forms, such as periodic signals, aperiodic signals, correlation signals, and non-correlation signals.

In this embodiment, the training sequence signals interpolated into the transmission signals of the transmitter may be interpolated in a consecutive manner, or in a spaced manner, and may be may be interpolated in an equally-spaced manner, or in an unequally-spaced manner. And furthermore, the number of the training sequence signals may be determined as actually demanded.

For example, the training sequence signals interpolated into the transmission signals of the transmitter may be expressed as:

$$S(k)=I(k)+jQ(k) \quad (4);$$

where, S(k) denotes a transmission signal at a k-th moment (occurrence), i.e. the training sequence signal, I(k) denotes an I path signal in the training sequence signal, and Q(k) denotes a Q path signal in the training sequence signal.

Hence, the modified signals obtained by the second determining unit 102 according to the estimated values a and b of the imperfection parameter of the transmitter, i.e. the estimated values of the amplitude imbalance, $\theta_I$ and $\theta_Q$, i.e. the estimated values of the phase imbalance, and the direct current bias $I_0+jQ_0$, may be expressed as:

$$S_{out}(k)=ae^{j\theta_I}*I(k)+be^{j\theta_Q}*jQ(k)+I_0+jQ_0 \quad (5);$$

where, $S_{out}(k)$ denotes the modified signals corresponding to the training sequence signal, I(k) denotes the I path signal in the training sequence signal, Q (k) denotes the Q path signal in the training sequence signal, a and b respectively denote amplitudes of the I path and the Q path, $\theta_I$ and $\theta_Q$ respectively denote phases of the I path and the Q path, and $I_0+jQ_0$ denotes the direct current bias of the transmitter.

In this embodiment, the third determining unit 103 determines the phase noises of the received signals according to the modified signals. A structure of the third determining unit 103 and a method for determining the phase noise shall be illustrated below.

Figure 2:
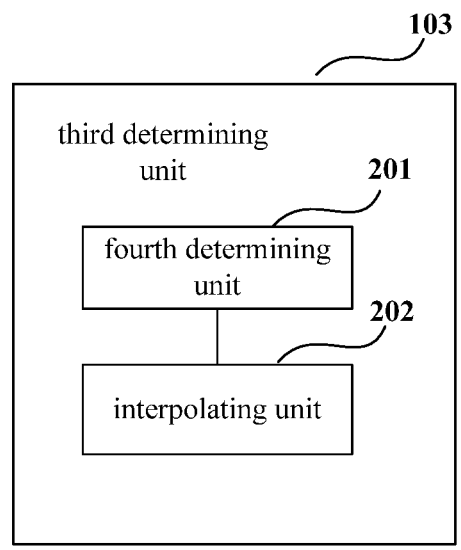
FIG. 2 is a schematic diagram of a determining unit according to an embodiment of this disclosure.

FIG. 2 is a schematic diagram of the third determining unit 103 of Embodiment 1 of this disclosure. As shown in FIG. 2, the third determining unit 103 includes:

a fourth determining unit 201 configured to determine phase noises corresponding to the training sequence signals according to the received signals at a moment of the training sequence signals and the modified signals corresponding to the training sequence signals; and an interpolating unit 202 configured to perform interpolation on the phase noises corresponding to the training sequence signals to obtain phase noises of the received signals at all moments.

In this embodiment, the fourth determining unit 201 determines the phase noises corresponding to the training sequence signals according to the received signals at the moments of the training sequence signals and the modified signals corresponding to the training sequence signals.

For example, the moment of the training sequence signals is a k-th moment, before the phase noise compensation is performed, the received signals at the moment of the training sequence signal is Y(k), and the modified signal corresponding to the training sequence signal is $S_{out}(k)$.

Figure 3:
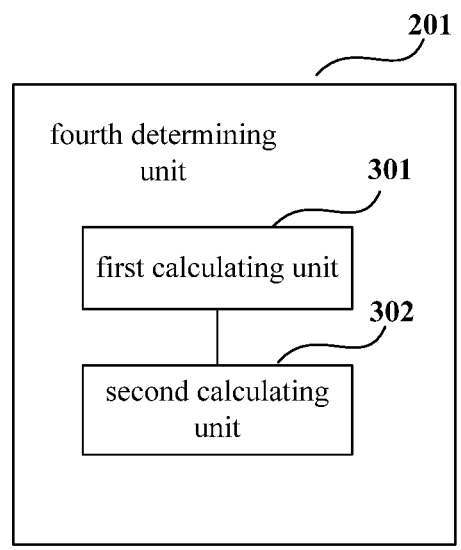
FIG. 3 is a schematic diagram of a determining unit according to an embodiment of this disclosure.

FIG. 3 is a schematic diagram of the fourth determining unit 201 of Embodiment 1 of this disclosure. As shown in FIG. 3, the fourth determining unit 201 includes:

a first calculating unit 301 configured to multiply the modified signals corresponding to the training sequence signals by the received signals at the moments of the training sequence signals after performing a conjugating operation on the modified signals corresponding to the training sequence signals; and a second calculating unit 302 configured to take angles of results of the multiplication to obtain the phase noises corresponding to the training sequence signals.

For example, the first calculating unit 301 multiplies the modified signal $S_{out}(k)$ corresponding to the training sequence signal S(k) after performing the conjugating operation by the received signals Y(k) at the moment k of the training sequence signal S(k), according to above formulas (3)-(5), the angle of the result of the multiplication is taken to obtain the phase noise $\varphi(k)$ corresponding to the training sequence signal S(k).

In this embodiment, the number of the training sequence signals interpolated into the transmission signals may be multiple, and at this moment, the second determining unit 102 determines a plurality of modified signals corresponding to the training sequence signals, the first calculating unit 301 multiplies the modified signals by the received signals at the moments of the training sequence signals after performing the conjugating operation on the modified signals to obtain a plurality of results of multiplication, and the second calculating unit 302 averages a plurality of results of the multiplication, and takes angles of the averaged results of the multiplication to obtain the phase noises corresponding to the training sequence signals.

Hence, by averaging the plurality of results of the multiplication, effects of white noises on phase noise estimation may be eliminated, thereby further improving accuracy of the phase noise estimation.

In this embodiment, the interpolating unit 202 performs interpolation on the phase noises corresponding to the training sequence signals to obtain phase noises to which non-training sequence signals correspond, thereby obtaining the phase noises of the received signals at all moments.

For example, such existing interpolation methods as linear interpolation, and cubic spline interpolation, etc., may be used.

Figure 4:
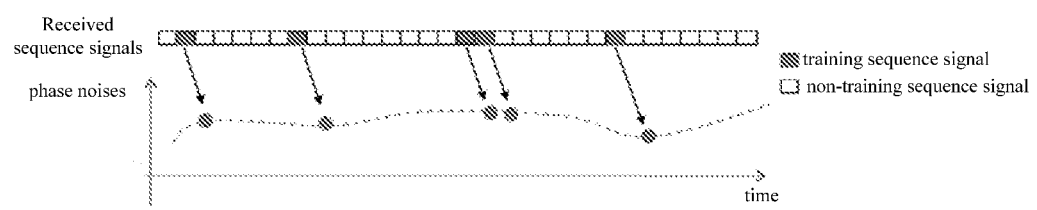
FIG. 4 is a schematic diagram of performing interpolation according to an embodiment of this disclosure.

FIG. 4 is a schematic diagram of performing interpolation in Embodiment 1 of this disclosure. As shown in FIG. 4, by performing interpolation on the phase noises corresponding to the training sequence signals, the phase noises of the received signals at all moments are obtained.

In this embodiment, after the phase noises of the received signals at all moments are obtained, the compensating unit 104 performs phase noise compensation on the received signals according to the phase noises of the received signals. And reference may be made to related techniques for a specific method of compensation.

It can be seen from the above embodiment that the modified signals are determined according to the estimated values of the imperfection parameter of the transmitter and the training sequence signals in the transmission signals, and the phase noises of the received signals are determined according to the modified signals, hence, the effect of the imperfection parameter of the transmitter on the phase noise is taken into account, and the phase noise may be accurately estimated, thereby performing compensation on the phase noise effectively, and ensuring the transmission efficiency and performance of the system.

Embodiment 2

The embodiment of this disclosure provides a receiver, including the phase noise compensation apparatus as described in Embodiment 1. Reference may be made to the disclosure contained in Embodiment 1 for a specific structure and functions of the phase noise compensation apparatus, which shall not be described herein any further.

Figure 5:
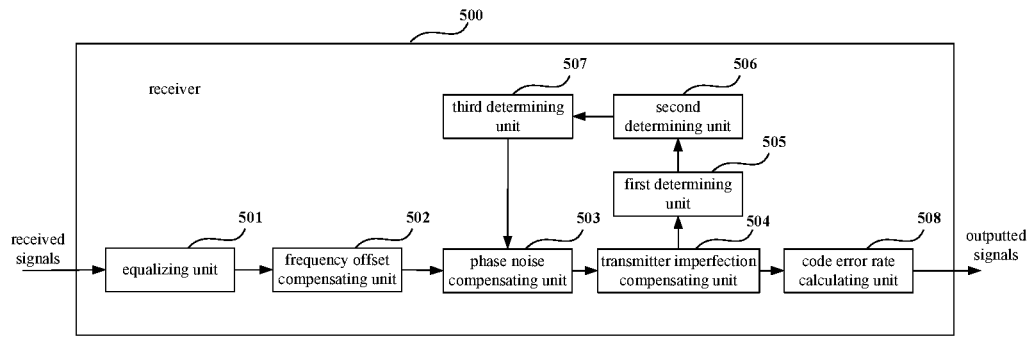
FIG. 5 is a block diagram of a systematic structure of a receiver according to an embodiment of this disclosure.

FIG. 5 is a block diagram of a systematic structure of the receiver of Embodiment 2 of this disclosure. As shown in FIG. 5, a receiver 500 includes: an equalizing unit 501, a frequency offset compensating unit 502, a phase noise compensating unit 503, a transmitter imperfection compensating unit 504, a first determining unit 505, a second determining unit 506, a third determining unit 507 and a code error rate calculating unit 508.

In this embodiment, reference may be made to the related art for specific structures and functions of the equalizing unit 501, the frequency offset compensating unit 502, the transmitter imperfection compensating unit 504 and the code error rate calculating unit 508.

In this embodiment, reference may be made to the disclosure contained in Embodiment 1 for specific structures and functions of the phase noise compensating unit 503, the first determining unit 505, the second determining unit 506 and the third determining unit 507.

As shown in FIG. 5, received signals are processed by the equalizing unit 501 and the frequency offset compensating unit 502, then are compensated for phase noises by the phase noise compensating unit 503 and t compensated for transmitter imperfections by the transmitter imperfection compensating unit 504, and is finally outputted via the code error rate calculating unit 508. For example, the first determining unit 505 determines estimated values of a imperfection parameter of the transmitter based on the transmitter imperfection compensating unit 504, the second determining unit 506 determines modified signals, and the third determining unit 507 determines phase noises according to the modified signals, which are used by the phase noise compensating unit 503 for performing phase noise compensation.

In this embodiment, the functions of the phase noise compensating unit 503, the first determining unit 505, the second determining unit 506 and the third determining unit 507 may be executed by a processor of the receiver, such as a digital signal processor (DSP) of the receiver.

It can be seen from the above embodiment that the modified signals are determined according to the estimated values of the imperfection parameter of the transmitter and the training sequence signals in the transmission signals, and the phase noises of the received signals are determined according to the modified signals, hence, the effect of the imperfection parameter of the transmitter on the phase noise is taken into account, and the phase noise may be accurately estimated, thereby performing compensation on the phase noise effectively, and ensuring the transmission efficiency and performance of the system.

Embodiment 3

The embodiment of this disclosure provides a phase noise compensation method, corresponding to the phase noise compensation apparatus as described in Embodiment 1.

Figure 6:
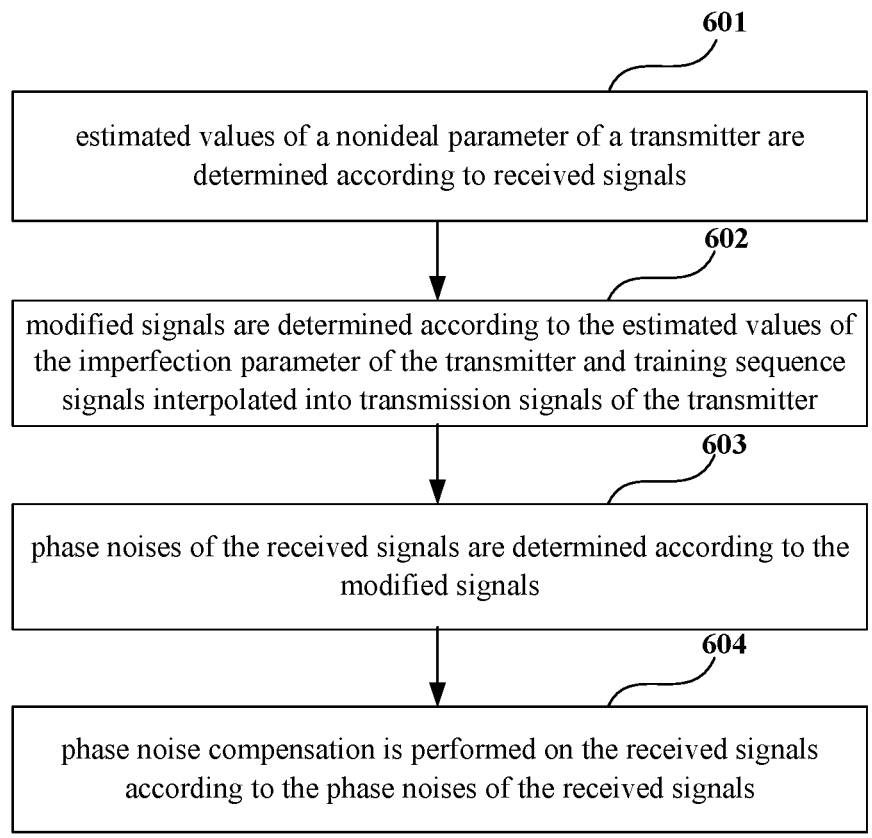
FIG. 6 is a flowchart of a phase noise compensation method according to an embodiment of this disclosure.

FIG. 6 is a flowchart of the phase noise compensation method of Embodiment 3 of this disclosure. As shown in FIG. 6, the method includes:

Operation 601: estimated values of an imperfection parameter of a transmitter are determined according to received signals;

Operation 602: modified signals are determined according to the estimated values of the imperfection parameter of the transmitter and training sequence signals interpolated into transmission signals of the transmitter;

Operation 603: phase noises of the received signals are determined according to the modified signals; and Operation 604: phase noise compensation is performed on the received signals according to the phase noises of the received signals.

Figure 7:
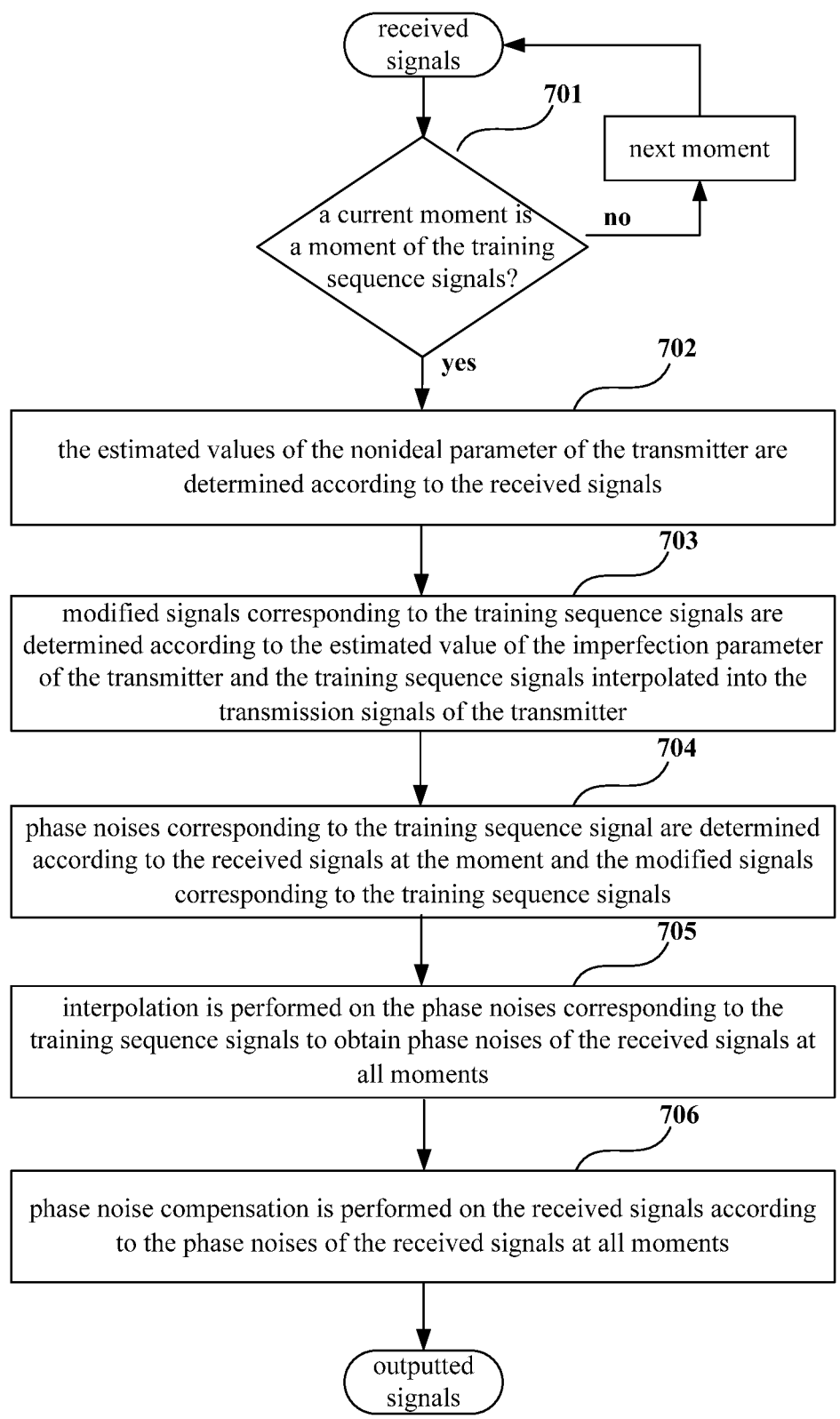
FIG. 7 is another flowchart of a phase noise compensation method according to an embodiment of this disclosure.

FIG. 7 is another flowchart of the phase noise compensation method of Embodiment 3 of this disclosure. As shown in FIG. 7, the method includes:

Operation 701: it is determined whether a current moment is a moment of the training sequence signals, entering into operation 702 when it is determined "yes", and entering into a next moment when it is determined "no";

Operation 702: the estimated values of the imperfection parameter of the transmitter are determined according to the received signals;

Operation 703: modified signals corresponding to the training sequence signals are determined according to the estimated value of the imperfection parameter of the transmitter and the training sequence signals interpolated into the transmission signals of the transmitter;

Operation 704: phase noises corresponding to the training sequence signal are determined according to the received signals at the moment and the modified signals corresponding to the training sequence signals;

Operation 705: interpolation is performed on the phase noises corresponding to the training sequence signals to obtain phase noises of the received signals at all moments; and Operation 706: phase noise compensation is performed on the received signals according to the phase noises of the received signals at all moments.

It can be seen from the above embodiment that the modified signals are determined according to the estimated values of the imperfection parameter of the transmitter and the training sequence signals in the transmission signals, and the phase noises of the received signals are determined according to the modified signals, hence, the effect of the imperfection parameter of the transmitter on the phase noise is taken into account, and the phase noise may be accurately estimated, thereby performing compensation on the phase noise effectively, and ensuring the transmission efficiency and performance of the system.

An embodiment of the present disclosure provides a computer readable program code, which, when executed in a phase noise compensation apparatus or a receiver, will cause a computer to carry out the phase noise compensation method as described in Embodiment 3 in the phase noise compensation apparatus or the receiver.

An embodiment of the present disclosure provides a computer storage medium, including a computer readable program code, which will cause a computer to carry out the phase noise compensation method as described in Embodiment 3 in a phase noise compensation apparatus or a receiver.

The phase noise compensation method carried out in the phase noise compensation apparatus or the receiver described with reference to the embodiments of this disclosure may be directly embodied as hardware, software modules executed by a processor, or a combination thereof. For example, one or more functional block diagrams and/or one or more combinations of the functional block diagrams shown in FIG. 1 may either correspond to software modules of procedures of a computer program, or correspond to hardware modules. Such software modules may respectively correspond to the operations shown in FIG. 6. And the hardware module, for example, may be carried out by firming the soft modules by using a field programmable gate array (FPGA).

The soft modules may be located in an RAM, a flash memory, an ROM, an EPROM, and an EEPROM, a register, a hard disc, a floppy disc, a CD-ROM, or any memory medium in other forms known in the art. A memory medium may be coupled to a processor, so that the processor may be able to read information from the memory medium, and write information into the memory medium; or the memory medium may be a component of the processor. The processor and the memory medium may be located in an ASIC. The soft modules may be stored in a memory of a mobile terminal, and may also be stored in a memory card of a pluggable mobile terminal. For example, when equipment (such as a mobile terminal) employs an MEGA-SIM card of a relatively large capacity or a flash memory device of a large capacity, the soft modules may be stored in the MEGA-SIM card or the flash memory device of a large capacity.

One or more functional blocks and/or one or more combinations of the functional blocks in FIG. 1 may be realized as a universal processor, a digital signal processor (DSP), an application-specific integrated circuit (ASIC), a field programmable gate array (FPGA) or other programmable logic devices, discrete gate or transistor logic devices, discrete hardware component or any appropriate combinations thereof carrying out the functions described in this application. And the one or more functional block diagrams and/or one or more combinations of the functional block diagrams in FIG. 1 may also be realized as a combination of computing equipment, such as a combination of a DSP and a microprocessor, multiple processors, one or more microprocessors in communication combination with a DSP, or any other such configuration.

This disclosure is described above with reference to particular embodiments. However, it should be understood by those skilled in the art that such a description is illustrative only, and not intended to limit the protection scope of the present disclosure. Various variants and modifications may be made by those skilled in the art according to the principle of the present disclosure, and such variants and modifications fall within the scope of the present disclosure.

What is claimed is:

1. A phase noise compensation apparatus, comprising:
a memory;
a processor coupled to the memory, the processor configured to:
determine estimated values of an imperfection parameter that affects performance of a transmitter according to received signals,
determine modified signals according to the determined estimated values of the imperfection parameter of the transmitter and training sequence signals interpolated into transmission signals of the transmitter,
determine phase noises of the received signals according to the modified signals, and
perform a phase noise compensation on the received signals according to the phase noises of the received signals,
wherein the processor is further configured to:
determine phase noises corresponding to the training sequence signals according to the received signals at occurrences of the training sequence signals and the modified signals corresponding to the training sequence signals, and
perform interpolation on the phase noises corresponding to the training sequence signals to obtain phase noises of the received signals at all occurrences.

2. The phase noise compensation apparatus according to claim 1, wherein the processor is further configured to:
multiply the modified signals corresponding to the training sequence signals by the received signals at the occurrences of the training sequence signals after performing a conjugating operation on the modified signals corresponding to the training sequence signals, and
take angles of results of the multiplication to obtain the phase noises corresponding to the training sequence signals.

3. The phase noise compensation apparatus according to claim 2, wherein the processor is further configured to:
determine a plurality of modified signals corresponding to a plurality of training sequence signals,
multiply the plurality of modified signals respectively by the received signals at occurrences of the plurality of training sequence signals after performing a conjugating operation on the plurality of modified signals to obtain a plurality of results of the multiplication, and
average the plurality of results of the multiplication and take angles of averaged results of the multiplication to obtain the phase noises corresponding to the training sequence signals.

4. The phase noise compensation apparatus according to claim 1, wherein,
the estimated values of the imperfection parameter of the transmitter comprises at least one of estimated values of amplitude imbalance of an I path and a Q path of the transmitter, phase imbalance of the I path and the Q path of the transmitter, and a transmitter direct current bias.

5. A receiver, comprising the phase noise compensation apparatus as claimed in claim 1.

6. A phase noise compensation method, comprising:
- determining estimated values of an imperfection parameter that affects performance of a transmitter according to received signals;
- determining modified signals according to the determined estimated values of the imperfection parameter of the transmitter and training sequence signals interpolated into transmission signals of the transmitter;
- determining phase noises of the received signals according to the modified signals; and
- performing a phase noise compensation on the received signals according to the phase noises of the received signals,
- wherein the determining phase noises of the received signals according to the modified signals comprises:
  - determining phase noises corresponding to the training sequence signals according to the received signals at occurrences of the training sequence signals and the modified signals corresponding to the training sequence signals, and
  - performing interpolation on the phase noises corresponding to the training sequence signals to obtain phase noises of the received signals at all occurrences.

7. The phase noise compensation method according to claim 6, wherein the determining phase noises corresponding to the training sequence signals according to the received signals at the occurrences of the training sequence signals and the modified signals corresponding to the training sequence signals comprises:
- multiplying the modified signals corresponding to the training sequence signals by the received signals at occurrences of the training sequence signals after performing a conjugating operation on the modified signals corresponding to the training sequence signals, and
- taking angles of results of the multiplication to obtain the phase noises corresponding to the training sequence signals.

8. The phase noise compensation method according to claim 7, wherein,
- a plurality of modified signals corresponding to a plurality of training sequence signals are determined,
- the plurality of modified signals are respectively multiplied by the received signals at occurrences of the plurality of training sequence signals after performing a conjugating operation on the plurality of modified signals to obtain a plurality of results of multiplication, and
- the plurality of results of the multiplication are averaged and angles of averaged results of the multiplication are taken to obtain the phase noises corresponding to the training sequence signals.

\* \* \* \* \*